US008732540B2

(12) United States Patent
Lee et al.

(10) Patent No.: US 8,732,540 B2
(45) Date of Patent: May 20, 2014

(54) SEMICONDUCTOR DEVICE HAVING INPUT/OUTPUT WRAPPERS, AND A METHOD OF CONTROLLING THE WRAPPERS (75) Inventors: JongPil Lee, Suwon-si (KR); JaeYoung Lee, Hwaseong-si (KR); Mookyung Kang, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 219 days.

(21) Appl. No.: 13/107,123

(22) Filed: May 13, 2011

(65) Prior Publication Data
US 2011/0279160 A1 Nov. 17, 2011

(51) Int. Cl.
*G01R 31/28* (2006.01)
(52) U.S. Cl.
USPC .................... 714/727; 714/731; 714/734
(58) Field of Classification Search
USPC ................ 714/77, 726, 731, 733–734, 302
See application file for complete search history.

(56) References Cited

U.S. PATENT DOCUMENTS

| | | | | |
|---|---|---|---|---|
| 6,405,335 | B1 * | 6/2002 | Whetsel | 714/726 |
| 6,851,079 | B1 | 2/2005 | Hergott | |
| 7,120,843 | B2 * | 10/2006 | Whetsel | 714/726 |
| 7,512,851 | B2 * | 3/2009 | Wang et al. | 714/726 |

FOREIGN PATENT DOCUMENTS

| | | |
|---|---|---|
| JP | 06-045447 | 2/1994 |
| JP | 2002-131390 | 5/2002 |
| JP | 2003-057309 | 2/2003 |
| KR | 1020050073841 | 7/2005 |

* cited by examiner

*Primary Examiner* — Christine Tu
(74) *Attorney, Agent, or Firm* — F. Chau & Associates, LLC (57) ABSTRACT

A semiconductor device include a first wrapper including a first scan flip-flop, first control flip-flops and a first pad, the first scan flip-flop receiving a first value and second values and storing the second value for determining a function of the first pad; a second wrapper including a second scan flip-flop, second control flip-flops and a second pad, the second scan flip-flop receiving the first value from the first wrapper and storing the first value for determining a function of the second pad; and an input/output controller configured to provide a shift input signal having the first and second values to the first wrapper.

26 Claims, 8 Drawing Sheets

| FSEL[1:0] | CFF1 | CFF2 | CFF3 | CFF4 |
|---|---|---|---|---|
| 00 | 1 | 0 | 0 | 0 |
| 01 | 0 | 1 | 0 | 0 |
| 10 | 0 | 0 | 1 | 0 |
| 11 | 0 | 0 | 0 | 1 |

Fig. 5

| TST_EN | FCS1 | FCS2 | FCS3 | FCS4 |
|---|---|---|---|---|
| 0 | CQ[0] | CQ[1] | CQ[2] | CQ[3] |
| 1 | TST[0] | TST[1] | TST[2] | TST[3] |

| Shift | SFF_1 | SFF_2 | SFF_3 | SFF_4 | SFF_5 | SFF_6 |
|---|---|---|---|---|---|---|
| 1st | 0 | X | X | X | X | X |
| 2nd | 0 | 0 | X | X | X | X |
| 3rd | 1 | 0 | 0 | X | X | X |
| 4th | 1 | 1 | 0 | 0 | X | X |
| 5th | 0 | 1 | 1 | 0 | 0 | X |
| 6th | 1 | 0 | 1 | 1 | 0 | 0 |

SEMICONDUCTOR DEVICE HAVING INPUT/OUTPUT WRAPPERS, AND A METHOD OF CONTROLLING THE WRAPPERS

CROSS-REFERENCE TO RELATED APPLICATIONS

This U.S. non-provisional patent application claims priority under 35 U.S.C. §119 to Korean Patent Application No. 10-2010-0045525, filed on May 14, 2010, the entirety of which is hereby incorporated by reference.

BACKGROUND

1. Technical Field

The present disclosure herein relates to semiconductor devices and, more particularly, to a semiconductor device having input/output wrappers (I/O wrappers).

2. Description of Related Art

Semiconductor devices provide an input/output pad (hereinafter referred to as "IO PAD") as an input/output function of a signal. However, a system on chip (hereinafter referred to as "SoC") demands IO PAD to function for various purposes. For example, an IO PAD provides additional functions such as adjustment of input/output resistance, adjustment of a level of an input/output signal, and adjustment of a slew rate of an input/output signal. The increase of functions that IO PAD provides requires complex control signal and thus, increases chip size.

SUMMARY

In an embodiment of the inventive concept, a semiconductor device comprises a first wrapper including a first scan flip-flop, first control flip-flops and a first pad, the first scan flip-flop receiving a first value and second values and storing the second value for determining a function of the first pad; a second wrapper including a second scan flip-flop, second control flip-flops and a second pad, the second scan flip-flop receiving the first value from the first wrapper and storing the first value for determining a function of the second pad; and an input/output controller configured to provide a shift input signal having the first and second values to the first wrapper.

In a preferred embodiment, the input/output controller is further configured to provide a test mode signal to the first and second wrapper, the first and second wrapper converting the test mode signal to a test signal and a reset signal, respectively. The first wrapper further includes a demultiplexer, the demultiplexer receiving the first value and routing the first value to one of the first control flip-flops in response to a function selection signal. The first control flip-flops are configured to receive an output of the demultiplexer and the reset signal and generate control information in response to an update signal, respectively. The first wrapper further includes a plurality of multiplexers, each of the multiplexers receiving the control information and test signal and generating an IO PAD function control signal in response to a test enable signal. The number of the first control flip-flops corresponds to that of functions that the first pad provides, and the number of the second control flip-flops corresponds to that of functions that the second pad provides.

In an another embodiment of the inventive concept, a semiconductor device comprises a first wrapper including a first pad and a first scan flip-flop, the first scan flip-flop receiving a first to third values and storing the third value for determining a function of the first pad; a second wrapper including a second pad and a second scan flip-flop, the second flip-flop receiving the second and third values and storing the second value for determining a function of the second pad; a third wrapper including a third pad and a third scan flip-flop, the third scan flip-flop receiving and storing the first value for determining a function of the third pad; and an input/output controller configured to provide a shift input signal having the first to third values to the first wrapper.

In a preferred embodiment, the input/output controller is configured to further provide the third wrapper with a clock signal, the clock signal running from the third wrapper to the first wrapper. The shift input signal runs from the first scan flip-flop to the third scan flip-flop in synchronization with the clock signal. The input/output controller is further configured to provide a test mode signal, the second wrapper including a look-up table configured to convert the test mode signal into a test signal and a reset signal. The second wrapper further includes control flip flops, each of the control flip-flops receiving the second value and the reset signal and generating a control information in response to an update signal. The second wrapper determines a function of the second pad according to output signals of the control flip-flops or the test signal in response to a test enable signal. The control flip-flops reset in response to the reset signal. The second wrapper further includes first and second capture units, the first capture unit selecting one of the stored values of the control flip-flops according to the selection signal, and the second capture unit transferring one of the stored value of the second scan flip-flop and the selected value of the first capture unit to the third wrapper in response to a capture signal from the input/output controller.

In an another embodiment of the inventive concept, a semiconductor device comprises a plurality of wrappers, each of the wrappers including a scan flip-flop and a pad and being serially connected to one another by the scan flip-flop; and an input/output controller configured to provide signals in a first direction and provide a clock signal in a second direction to the plurality of wrappers, wherein the scan flip flop stores a shift input signal among the signals in response to the clock signal.

In an another embodiment of the inventive concept, the wrappers are configured to convert the test mode signal among the signals to a test signal and a reset signal, respectively. Each of the wrappers further includes a demultiplexer and control flip-flops, the demultiplexer electrically being coupled to the scan flip-flop and routing a stored value in the scan flip-flop to one of the control flip-flops in response to a function selection signal. The control flip-flops are configured to receive an output of the demultiplexer and the reset signal and generate control information in response to an update signal, respectively. Each of the wrappers further includes a plurality of multiplexers, each of the multiplexers receiving the control information and test signal and generating an IO PAD function control signal in response to a test enable signal. The number of the control flip-flops corresponds to that of functions that the first pad provides.

In an another embodiment of the inventive concept, a method of controlling a plurality of wrappers, each of the wrappers including a pad and being serially connected to one another, the method comprising providing signals to one of the plurality of wrappers and a clock signal to another of the plurality of wrappers; and shifting the signals in a first direction in response to the clock signals transferred in a second direction at the each of the wrappers. A function of the pad is determined by a shifted signal at the each of the wrappers.

BRIEF DESCRIPTION OF THE DRAWINGS

The inventive concept will become more apparent in view of the attached drawings and accompanying detailed description. The embodiments depicted therein are provided by way of example, not by way of limitation, wherein like reference numerals refer to the same or similar elements. The drawings are not necessarily to scale, emphasis instead being placed upon illustrating aspects of the inventive concept.

DETAILED DESCRIPTION OF THE EMBODIMENTS

A semiconductor device according to an embodiment of the inventive concept includes a plurality of IO wrappers and an IO controller configured to control the IO wrappers. The IO wrappers constitute at least one IO san chain. Each of the IO wrappers includes an additional circuit for transferring control signals, which are transferred from an IO controller or a previous IO wrapper except an IO PAD taking charge of input/output of signals, to the next IO wrapper.

The IO controller transfers control signals only to a first IO wrapper in an IO scan chain. Afterwards, the first IO wrapper transfers the control signals to a second IO wrapper. The second IO wrapper transfers the control signals to a third IO wrapper. Likewise an (N–1)th wrapper transfers the controls signals to an Nth wrapper. For example, IO wrappers that do not receive controls signals from the IO controller receive control signals from adjacent IO wrappers.

Accordingly, an area occupied control signal lines between the IO controller and the IO PADs is made smaller than that occupied when control signals are connected to each of all IO PADs. Thus, the integration density of a semiconductor device according to the inventive concept may be improved.

The inventive concept will now be described more fully hereinafter with reference to the accompanying drawings, in which preferred embodiments of the inventive concept are shown.

Figure 1:
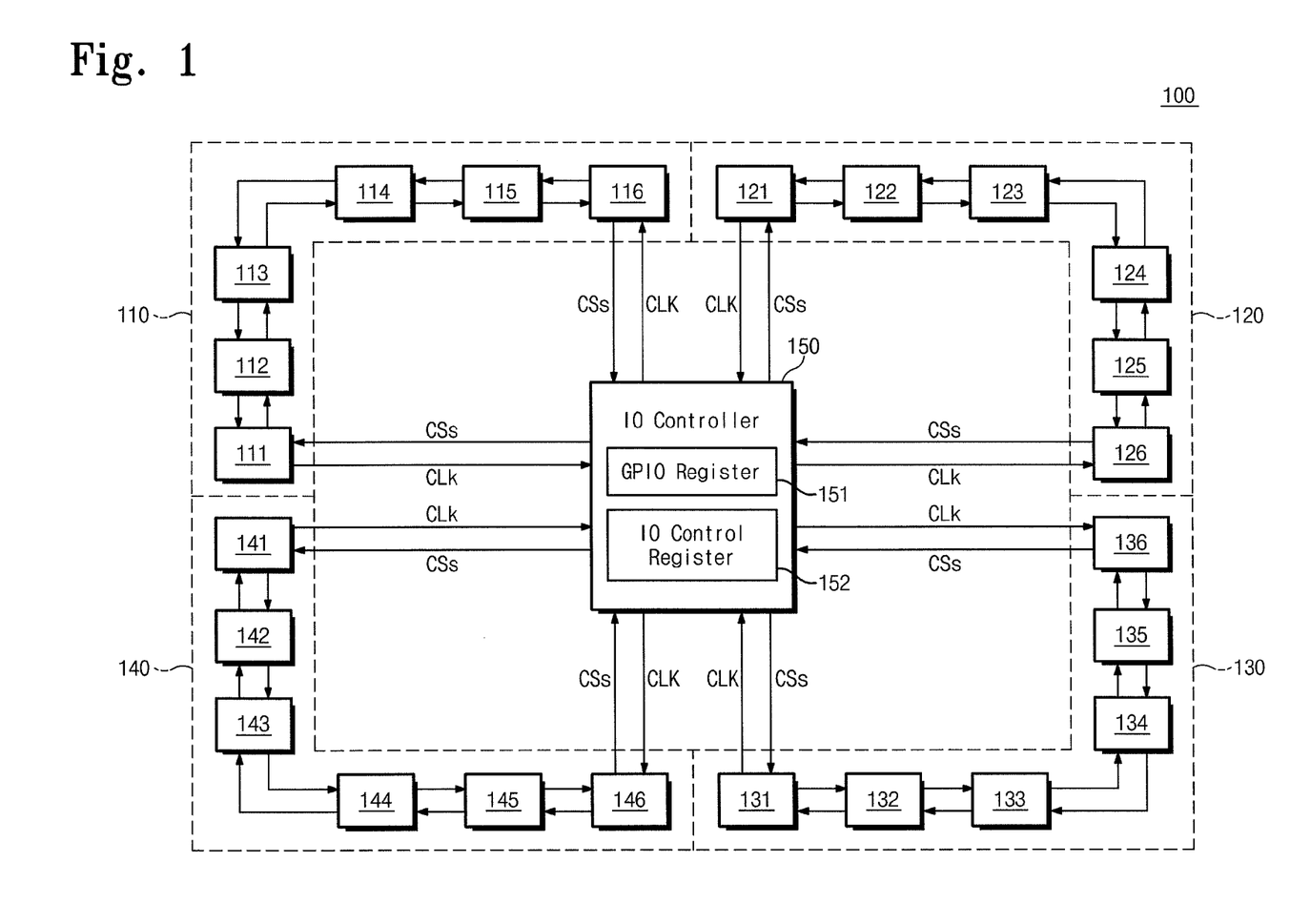
FIG. 1 is a block diagram of a semiconductor device according to an embodiment of the inventive concept.

FIG. 1 is a block diagram of a semiconductor device 100 according to an embodiment of the inventive concept. As illustrated, the semiconductor device 100 includes a plurality of IO wrappers 111~116, 121~126, 131~136, and 141~146 and an IO controller 150. The IO wrappers 111~116, 121~126, 131~136, and 141~146 constitute first to fourth IO scan chains 110~140, respectively.

For brevity of description, it is assumed that a plurality of IO wrappers constitute four IO scan chains and each of the IO scan chains includes six IO wrappers. However, it is apparent to those skilled in the art that constructions of a plurality of IO wrappers and IO scan chains are not limited thereto and various changes and modifications thereof may be made.

An IO chain scan may form, according to a driving voltage of an IO wrapper and an external device type such as a universal asynchronous receiver/transmitter (UART), a multi-memory controller (MMC), and an I2C connected to a driving voltage of an IO wrapper. For example, IO wrappers using the same driving voltage may each include one IO scan chain. Alternatively, IO wrappers connected to the same external device may each include one IO scan chain.

The construction and operation of each of the second to fourth IO scan chains 120~140 correspond to those of the first IO scan chain 110. In addition, a relationship between the first IO scan chain 110 and the IO controller 150 corresponds to that between each of the second to fourth IO scan chains 120~140 and the IO controller 150. Therefore, the second to fourth IO scan chains 120~140 will not be described in further detail. The construction and operation of each IO wrapper will be described later in detail with reference to FIGS. 3 to 7.

The first IO scan chain 110 includes first to sixth IO wrappers 111~116. The first IO wrapper 111 receives control signals CSs from the IO controller 150. The first IO wrapper 111 transfers the control signals CSs to the second IO wrapper 112. The second IO wrapper 112 transfers the control signals CSs to the third IO wrapper 113. The third IO wrapper 113 transfers the control signals CSs to the fourth IO wrapper 114. The fourth IO wrapper 114 transfers the control signals CSs to the fifth IO wrapper 115. The fifth IO wrapper 115 transfers the control signals CSs to the sixth IO wrapper 116. The sixth IO wrapper 116 transfers the control signals CSs to the IO controller 150.

For example, the IO controller 150 transfers control signals CSs only to the first IO wrapper 111, among the first to sixth IO wrappers 111~116. And each of the second to sixth IO wrappers 112~116 receives the IO control signals CSs from an adjacent IO wrapper. In this way, the first to sixth IO wrappers 111~116 and the IO controller 150 form a control signal transfer loop.

Meanwhile, a clock signal transfer loop is formed in an opposite direction to the control signal transfer loop. For example, the IO controller 150 transfers a clock signal CLK only to the sixth IO wrapper 116, among the first to sixth IO wrappers 111~116. And each of the first to fifth IO wrappers 111~115 receives the clock signal CLK from an adjacent IO wrapper. This is done to prevent abnormal synchronization of the control signals CSs which results from a delay of the clock signal CLK.

The IO controller 150 includes a general purpose input/output register (GPIO register) 151 and an input/output control register (IO control register) 152. The GPIO register 151 stores control information on the respective IO wrappers 111~116, 121~126, 131~136, and 141~146. The IO control register 152 stores control information on the respective IO scan chains 110~140.

As set forth above, the IO controller 150 transfers the control signals CSs and the clock signal CLK not to the respective IO wrappers 111~116, 121~126, 131~136, and 141~146 but to the respective IO scan chains 110~140. Thus, lines for transferring control signals CSs and a clock signal CLK in the semiconductor device 100 decrease in number.

Figure 2:
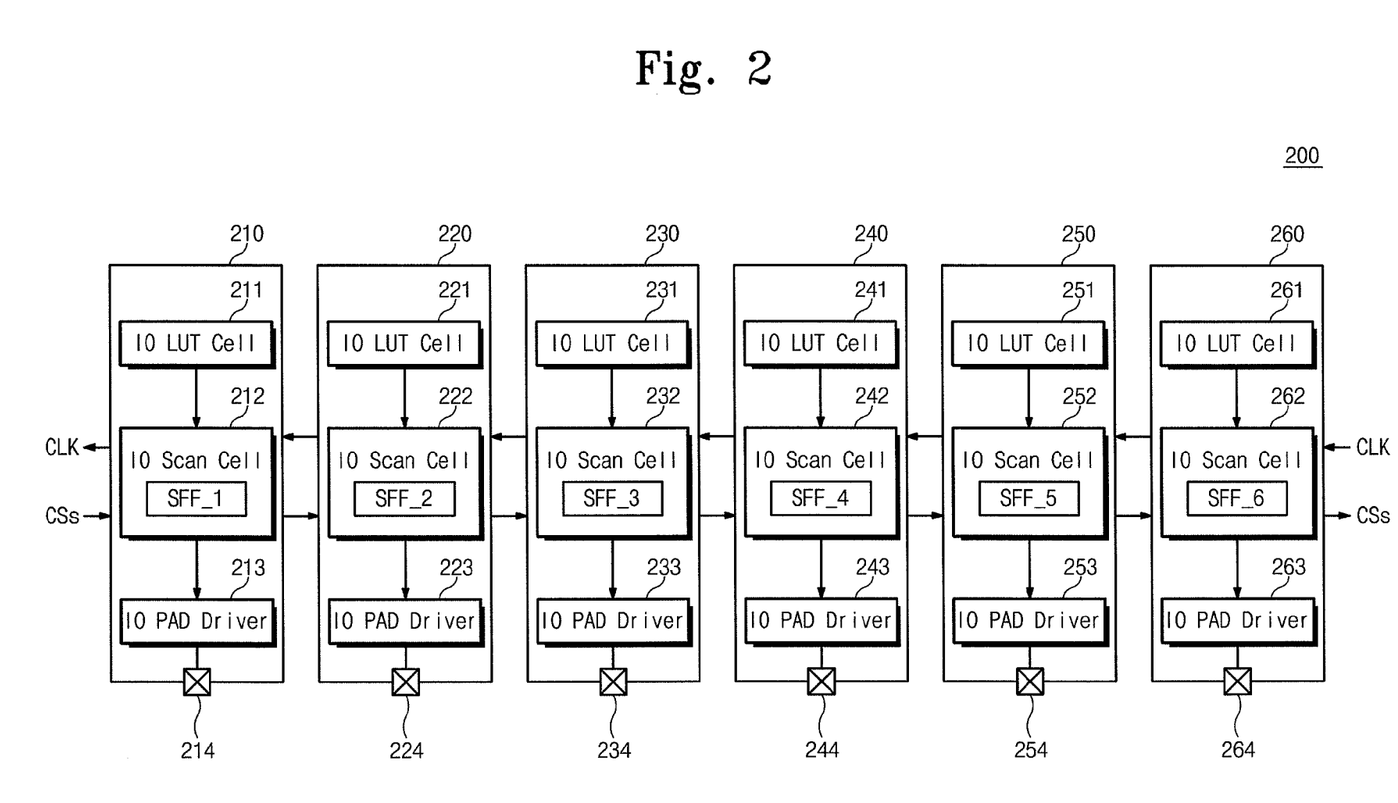
FIG. 2 is a block diagram of an IO scan chain shown in FIG. 1.

FIG. 2 is a block diagram of an IO scan chain shown in FIG. 1. Referring to FIG. 2, an IO scan chain 200 includes six IO wrappers 210~260. However, this is merely exemplary and it is apparent to those skilled in the art that the number of IO wrappers constituting one IO scan chain is not limited thereto.

Each of the IO wrappers 210~260 includes input/output look-up table cells (hereinafter, each being referred to as "IO LUT cell") 211~261, input/output scan cells (IO scan cells) 212~262, input/output PAD drivers (IO PAD drivers) 213~263, and IO PADs 214~264. Each of the IO scan cells includes scan flip-flops SFF_1~SFF_6.

The IO LUT cells 211~261 provide a test value and a reset value to the IO scan cells 212~262, respectively. The IO scan cells 212~262 transfer IO PAD function control signals to the IO PAD driver 213~263, respectively. Logic levels of the IO PAD function control signals are determined by the control information stored in the scan flip-flops SFF_1~SFF_6 or the test value and the reset value provided from the IO LUT cells 211~261, respectively. The IO PAD drivers 213~263 drive the IO PADs 214~264 in response to the IO PAD function control signals, respectively.

The IO PADs take charge of input/output of signals. Moreover, the IO PADs 214~264 provide additional functions such as adjustment of input/output resistance, adjustment of a level of an input/output signal, and adjustment of a slew rate of an input/output signal. These functions provided by the IO PADs 214~264 are controlled by the IO PAD function control signals.

As previously described with reference to FIG. 1, control signals CSs are transferred to the first IO wrapper 210. Thereafter, the second to sixth IO wrappers 220~260 receive the control signals CSs from adjacent IO wrappers, respectively. The first to fifth IO wrappers 210~250 receive a clock signal CLK from adjacent IO wrappers, respectively.

The first to sixth scan flip-flops SFF_1~SFF_6 constitute a shift register. For example, control information stored in the first to fifth scan flip-flops SFF_1~SFF_5 are transferred to adjacent scan flip-flops SFF_2~SFF_6 at each cycle of the clock signal CLK, respectively. For example, it is assumed that control values stored in the first to sixth scan flip-flops SFF_1~SFF_6 are '011000' and a control value transferred to the first flip-flop SFF_1 through a shift signal among the control signals CSs is '1'. Under the assumption, the control values '101100' are stored in the respective first to sixth scan flip-flops SFF_1~SFF_6 when one cycle passes by. The operations of the first to sixth flip-flops SFF_1~SFF_6 will be described in further detail later with reference to FIGS. 6 and 7.

Figure 3:
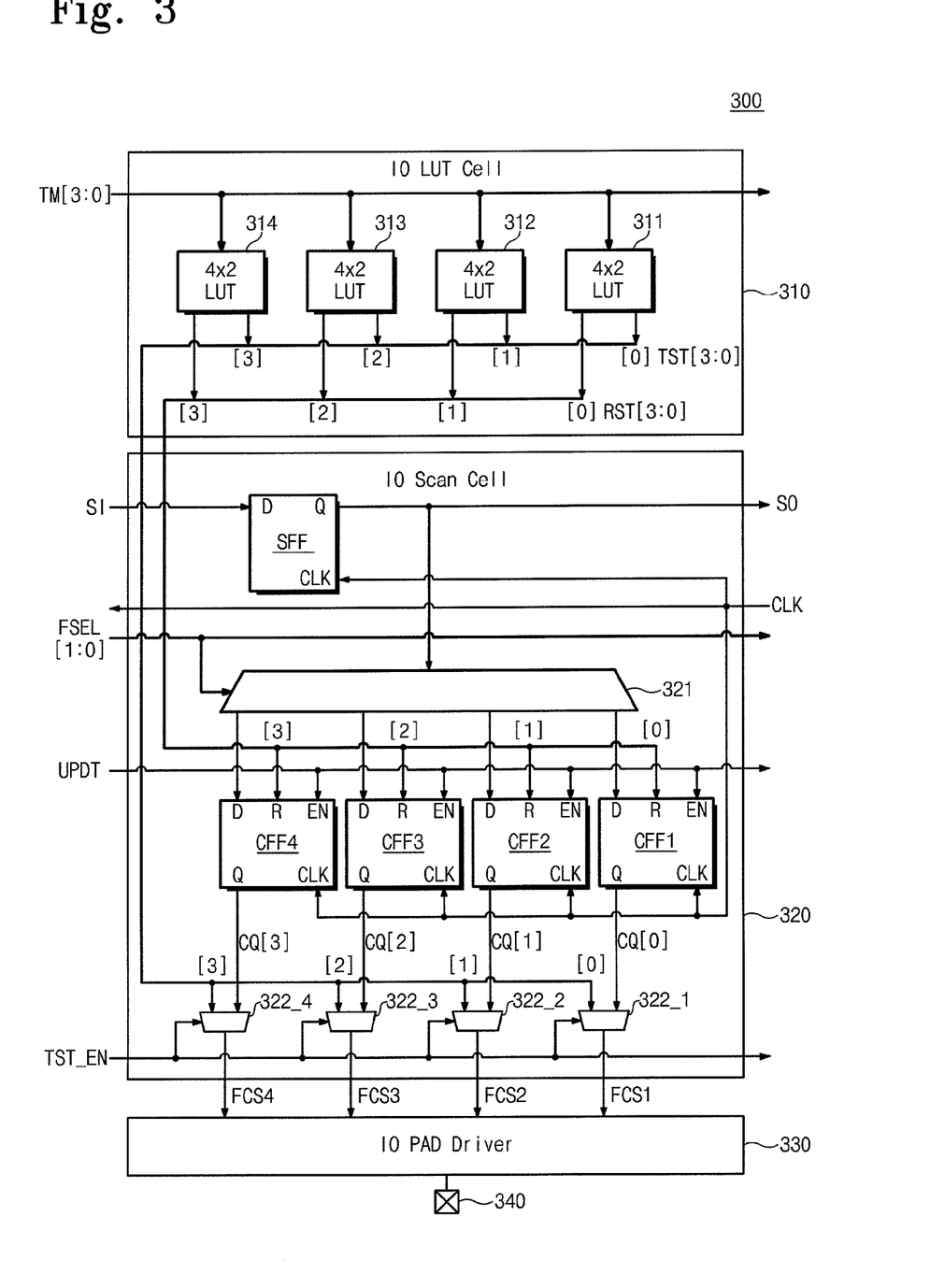
FIG. 3 is a circuit diagram illustrating one embodiment of the IO wrapper shown in FIG. 1.

FIG. 3 is a circuit diagram illustrating one embodiment of the IO wrapper shown in FIG. 1. An IO wrapper 300 includes an IO LUT cell 310, an IO scan cell 320, an IO PAD driver 330, and an IO PAD 340. For brevity of description, it is assumed that the IO PAD 340 provides four kinds of functions. The IO wrapper 300 receives a test mode signal TM[3:0], a shift input signal SI, a function selection signal FSEL[1:0], an update signal UPDT, and a test enable signal TST_EN as control signals CSs (see FIGS. 1 and 2). The IO wrapper 300 transfers the test mode signal TM[3:0], the shift input signal SI, the function selection signal FSEL[1:0], the update signal UPDT, and the test enable signal TST_EN to the next IO wrapper (not shown). At this point, a shift output signal SO is transferred as a shift input signal SI of the next wrapper (not shown).

The IO LUT cell 310 includes first to fourth look-up table (hereinafter, each being referred to as "LUT") 311~314. The number of LUTs corresponds to the number of functions provided by the IO PAD 340. For example, assuming that the number of functions provided by the IO PAD 340 is N, the number of LUTs is also N.

The IO LUT cell 310 transfers the test mode signal TM[3:0] to the next IO LUT (not shown) after receiving the test mode signal TM[3:0] among the control signals CSs. The IO LUT cell 310 generates a 4-bit test signal TST[3:0] and a 4-bit reset signal RST[3:0] in response to the test mode signal TM[3:0]. The test mode signal TM[3:0] includes first to fourth test values TST[0]~TST[3], and the reset signal RST[3:0] includes first to fourth reset values RST[0]~RST[3].

Each of the LUTs 311~314 converts 4 bits of information into a 1-bit test value and a 1-bit reset value. For example, the first LUT 311 converts the four bits of information transferred through the test mod signal TM[3:0] into a first test value TST[0] of the test ret signal TST[3:0] and a first reset value RST[0] of the reset signal RST[3:0]. The second LUT 312 converts the 4 bits of information transferred through the test mode signal TM[3:0] into a second test value TST[1] of the test signal TST[3:0] and a second reset value RST[1] of the reset signal RST[3:0]. The third LUT 313 converts the 4 bits of information transferred through the test mode signal TM[3:0] into a third test value TST[2] of the test signal TST[3:0] and a third reset value RST[2] of the reset signal RST[3:0]. The fourth LUT 314 converts the 4 bits of information transferred through the test mode signal TM[3:0] into a fourth test value TST[3] of the test signal TST[3:0] and a fourth reset value RST[3] of the reset signal RST[3:0].

The IO scan cell 320 includes a scan flip-flop SFF, first to fourth control flip-flops CFF1~CFF4, a demultiplexer 321, and first to fourth multiplexers 322_1~322_4. The number of control flip-flops and the number of multiplexers each correspond to the number of functions provided by the IO PAD 340. For example, assuming that the number of functions provided by the IO PAD 340 is N, the number of control flip-flops and the number of multiplexers are each also N.

The IO scan cell 320 receives a shift input signal SI, a 2-bit function selection signal FSEL[1:0], an update signal UPDT, and a test enable signal TST_EN among the control signals CSs. The IO scan cell 320 transfers the shift input signal SI, the 2-bit function selection signal FSEL[1:0], the update signal UPDT, and the test enable signal TST_EN to the next IO scan cell (not shown). A shift output signal SO is transferred as a shift input signal SI of the next IO scan cell (not shown).

The bit number of a function selection signal is determined according to the number of functions provided by the IO PAD 340. For example, assuming that the number of functions provided by the IO PAD 340 is N, the bit number of the function selection signal is $[\log_2 N]$ (wherein [x] represents a positive integer obtained by rounding up one decimal place of x).

The IO scan cell 320 receives a clock signal CLK from the next IO scan cell (not shown) to which the control signals CSs are transferred. Thereafter, the IO scan cell 320 transfers the clock signal CLK to a previous scan cell (not shown) transferring the control signals CSs. For example, a transfer direction of control signals is opposite to that of clock signals. As set forth above, this is done to prevent abnormal synchronization of the control signals CSs which results from a delay of the clock signal CLK.

The scan flip-fop SFF stores a control value transferred through the shift input signal SI in synchronization with the clock signal CLK and transfers a previous control value stored therein to the next flip-flop (not shown) through the shift output signal SO. The scan flip-flop SFF transfers the stored previous control value to the demultiplexer 321 in synchronization with the clock signal CLK.

The demultiplexer 321 transfers a control value transferred from the scan flip-flop SFF in response to a function selection signal FSEL[1:0] to one of the first to fourth control flip-flops CFF1~CFF4, which will be described below with reference to FIG. 4.

Figure 4:
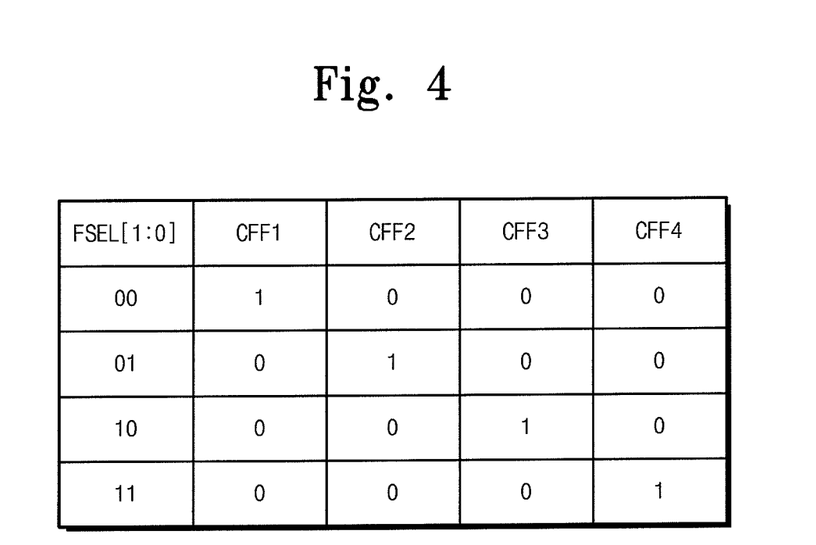
FIG. 4 is a table indicating which control flip-flop receives a control value according to a function selection signal.

FIG. 4 is a table indicating how demultiplexer 321 routes a control value to one of the control flip-flops CFF1~CFF4 in response to a function selection signal. It is assumed that the demultiplexer 321 receives a control value of '1'. Referring to FIG. 4, the demultiplexer 321 transfers the control value '1' to a first control flip-flop CFF1 when the function selection signal FSEL[1:0] has a value of '00'. The demultiplexer 321 transfers the control value '1' to a second control flip-flop CFF2 when the value of the function selection signal FSEL[1:0] is '01'. The demultiplexer 321 transfers the control value '1' to a third control flip-flop CFF3 when the value of the function selection signal FSEL[1:0] is '10'. The demultiplexer 321 transfers the control value '1' to a fourth control flip-flop CFF3 when the value of the function selection signal FSEL[1:0] is '11'.

Returning to FIG. 3, the first to fourth control flip-flops CFF1~CFF4 are enabled by the update signal UPDT. For example, the first to fourth control flip-flops CFF1~CFF4 store a control value that the demultiplexer 321 transfers in synchronization with the clock signal CLK only when the update signal UPDT is applied. Alternatively, the first to fourth control flip-flops CFF1~CFF4 store the first to fourth reset values RST[0]~RST[3] transferred from the IO LUT cell 310 in synchronization with the clock signal only when the update signal UPDT is applied, respectively. This means that the first to fourth flip-flops CFF1~CFF4 are preset to '1' or reset to '0' according to the first to fourth reset values RST[0]~RST[3].

The first to fourth control flip-flops CFF1~CFF4 transfers the stored previous control value (or previous preset value/reset value) to first to fourth multiplexers 322_1~322_4 in synchronization with the clock signal CLK.

For example, the first control flip-flop CFF1 transfers a previous control value (or previous preset value/reset value) stored as first control information CQ[0] to the first multiplexer 322_1. The second control flip-flop CFF2 transfers a previous control value (or previous preset value/reset value) stored as second control information CQ[1] to the second multiplexer 322_2. The third control flip-flop CFF3 transfers a previous control value (or previous preset value/reset value) stored as third control information CQ[2] to the third multiplexer 322_3. The fourth control flip-flop CFF4 transfers a previous control value (or previous preset value/reset value) stored as fourth control information CQ[3] to the fourth multiplexer 322_4.

The first to fourth multiplexers 322_1~322_4 selects first to fourth test values TST[0]~TST[3] or the first to fourth control values CQ[0]~CQ[3] according to a test enable signal TST_EN to transfer first to fourth IO PAD function control signals FCS1~FCS4 to the IO PAD driver 330.

Figure 5:
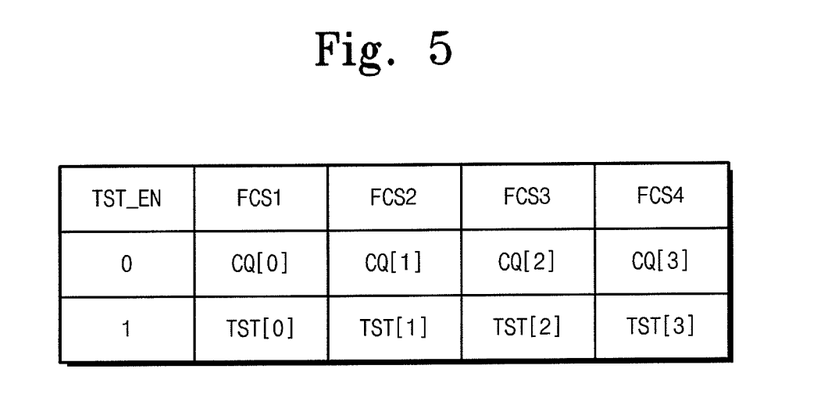
FIG. 5 is a table of IO pad function control signals depending on a test enable signal.

FIG. 5 is a table of IO pad function control signals depending on a test enable signal. Referring to FIG. 5, the first multiplexer 322_1 outputs a first test value TST[0] as a first IO PAD function control signal FCS1 when a test enable signal TST_EN is applied. On the other hand, the first multiplexer 322_1 outputs a first control value CQ[0] as a first IO PAD function control signal FCS1 when a test enable signal TST_EN is not applied.

The second multiplexer 322_2 outputs a second test value TST[1] as a second IO PAD function control signal FCS2 when the test enable signal TST_EN is applied. On the other hand, the second multiplexers 322_2 outputs a second control value CQ[1] as a second IO PAD function control signal FCS2 when a test enable signal TST_EN is not applied.

The third multiplexer 322_3 outputs a third test value TST[2] as a third IO PAD function control signal FCS3 when the test enable signal TST_EN is applied. On the other hand, the third multiplexers 322_3 outputs a third control value CQ[2] as a third IO PAD function control signal FCS3 when a test enable signal TST_EN is not applied.

The fourth multiplexer 322_4 outputs a fourth test value TST[3] as a fourth IO PAD function control signal FCS4 when the test enable signal TST_EN is applied. On the other hand, the fourth multiplexers 322_4 outputs a fourth control value CQ[3] as a fourth IO PAD function control signal FCS4 when a test enable signal TST_EN is not applied.

Returning to FIG. 3, the IO PAD driver 330 drives the IO PAD 340 in response to the first to fourth IO PAD function control signals FCS1~FCS4. As set forth above, the IO PAD 340 take charge of input/output of signals. Moreover, the IO PAD 340 provides additional functions such as adjustment of input/output resistance, adjustment of a level of an input/output signal, and adjustment of a slew rate of an input/output signal. These functions provided by the IO PAD 340 are controlled by the IO PAD function control signals FCS1~FCS4.

For example, assuming that the first IO PAD function control signal FCS1 is a signal connecting an input resistor in a pull-up configuration, the IO PAD driver 330 may drive IO PAD 340 to connect the input resistor to a driving voltage in response to the first IO PAD function control signal FCS1. Assuming that the second IO PAD function control signal FCS2 is a signal connecting an input resistor in a pull-down configuration, the IO PAD driver 330 may drive IO PAD 340 to connect the input resistor to a ground in response to the second IO PAD function control signal FCS2.

Figure 6:
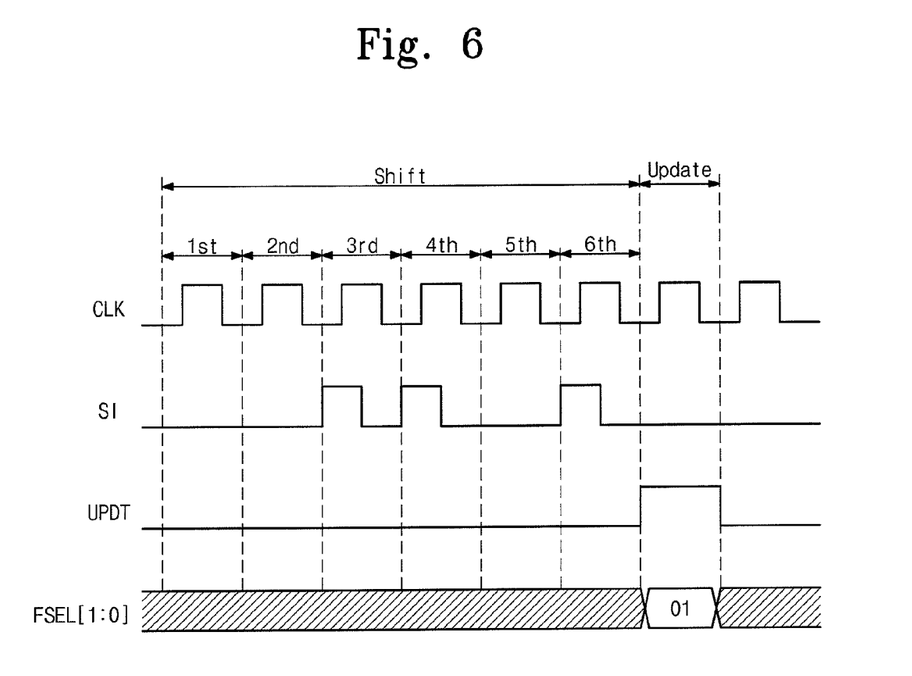
FIG. 6 is a timing diagram illustrating a shift operation and an update operation at the IO scan chain shown in FIG. 2.
Figure 7:
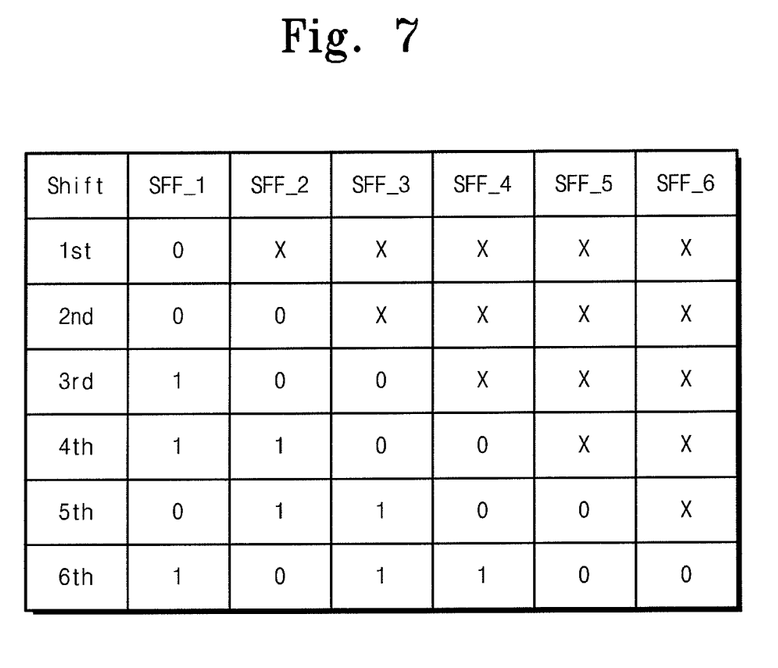
FIG. 7 is a table of control values stored in scan flip-flops during a shift operation at the IO scan chain shown in FIG. 2.

FIG. 6 is a timing diagram illustrating a shift operation and an update operation at the IO scan chain shown in FIG. 2, and FIG. 7 is a table of control values stored in scan flip-flops during a shift operation at the IO scan chain shown in FIG. 2. Referring to FIGS. 2, 6, and 7, as set forth above, the first to sixth scan flip-flops SFF1~SFF6 constitute a shift register. Control values stored in the first to sixth scan flip-flops SFF_1~SFF_6 are shifted in synchronization with the clock signal CLK.

When a shift input signal SI is high at the rising edge of the clock signal CLK, a control value '1' is stored in the first scan flip-flop SFF_1. Meanwhile, when a shift input signal SI is low at the rising edge of the clock signal CLK, a control value '0' is stored in the first scan flip-flop SFF_1. Control values stored in the first to fifth scan flip-flops SFF_1~SFF_5 are transferred to the next scan flip-flops SFF_2~SFF_6 at each cycle of the clock signal CLK. Thus, if six cycles of the clock signal CLK pass by (i.e., a shift operation is completed), control values '101100' are stored in the first to sixth scan flip-flops SFF_1~SFF_6, respectively.

At this point, as described with reference to FIG. 3, while the update signal UPDT is applied, the control values respectively stored in the scan flip-flops SFF_1~SFF_6 are transferred to and stored in one of control flip-flops in the first to sixth IO scan cells 212~262 according to the function selection signal FSEL[1:0].

Figure 8:
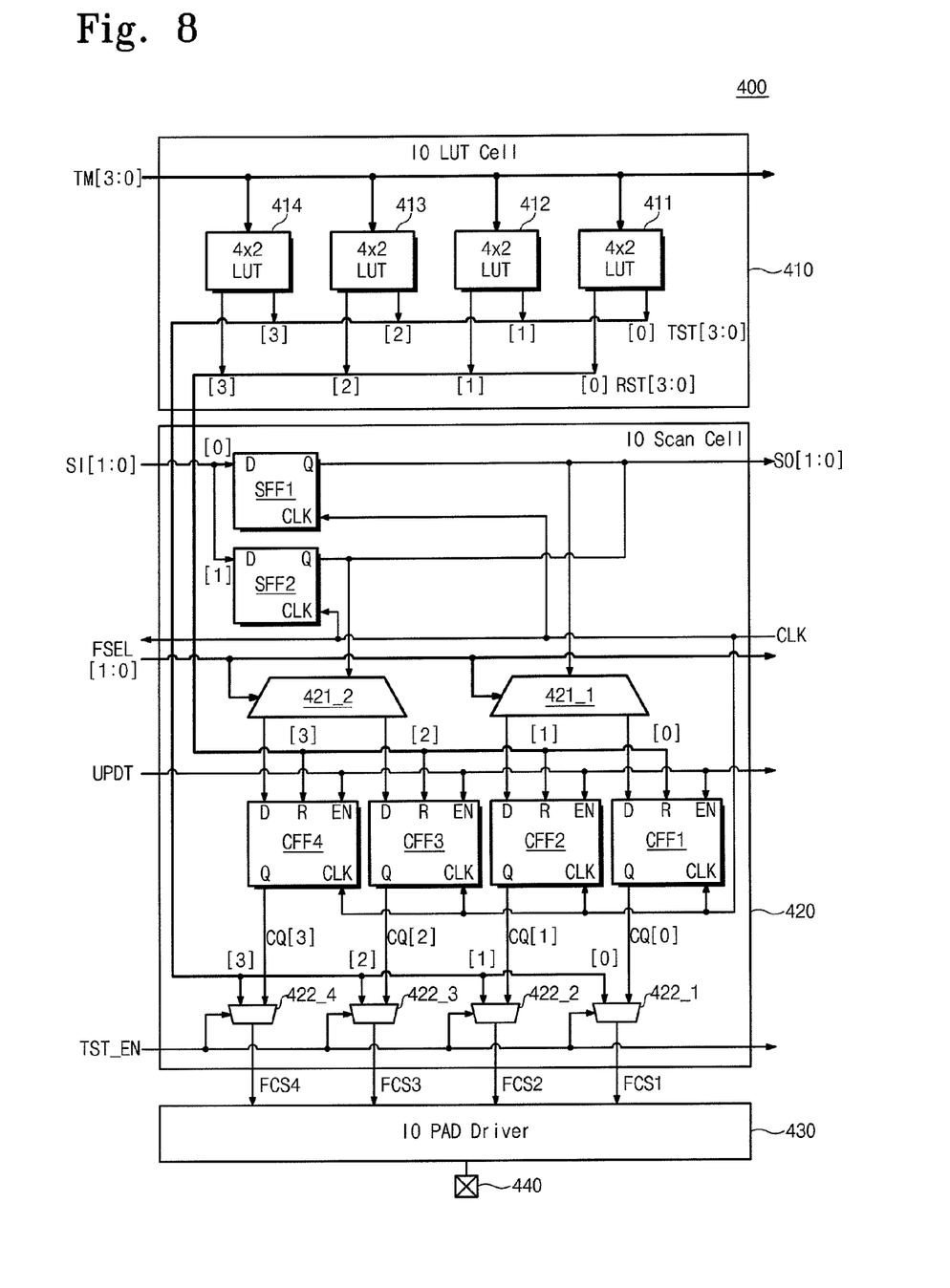
FIG. 8 is a circuit diagram illustrating another embodiment of the IO wrapper shown in FIG. 1.

FIG. 8 is a circuit diagram illustrating another embodiment of the IO wrapper shown in FIG. 1. An IO wrapper 400 according to another embodiment of the inventive concept is identical to the IO wrapper 300 shown in FIG. 3 except for configurations of first and second scan flip-flops SFF1 and SFF2 and first and second demultiplexers 421_1 and 421_2. Therefore, corresponding components between the IO wrappers 300 and 400 will not described in further detail.

Referring to FIG. 8, an IO scan cell 420 may include a plurality of scan flip-flops SFF1 and SFF2 and a plurality of demultiplexers 421_1 and 432_2. The number of scan flip-flops corresponds to the number of demultiplexers and the bit number of a shift input signal. For example, assuming that the number of scan flip-flops is N, the number of demultiplexers and the bit number of a shift input signal are each also N. For brevity of description, it is assumed that the IO scan cell 420 includes two scan flip-flops SFF1 and SFF2 and two demultiplexers 421_1 and 421_2.

The first scan flip-flop SFF1 stores a control value transferred through the first input signal SI[0] among the shift input signal SI[1:0] in synchronization with the clock signal CLK and transfers the stored previous control value to the next corresponding scan flip-flop (not shown) through the first output signal SO[0] among the shift output signal SO[1:0]. Also the first scan flop-flop SFF1 transfers the stored previous control value to the first demultiplexer 421_1 in synchronization with the clock signal CLK.

The second scan flip-flop SFF2 stores a control value transferred through the second input signal SI[0] among the shift input signal SI[1:0] in synchronization with the clock signal CLK and transfers the stored previous control value to the next corresponding scan flip-flop (not shown) through the second output signal SO[1] among the shift output signal SO[1:0]. Also the second scan flop-flop SFF2 transfers the stored previous control value to the second demultiplexer 421_2 in synchronization with the clock signal CLK.

The first demultiplexer 421_1 transfers the control value transferred from the first scan flip-flop SFF1 to one of the first and second control flip-flops CFF1 and CFF2 according to the function selection signal FSEL[1:0]. The second demultiplexer 421_2 transfers the control value transferred from the second scan flip-flop SFF2 to one of the third and fourth control flip-flops CFF3 and CFF4 according to the function selection signal FSEL[1:0].

According to the IO scan cell 420 including a plurality of scan flip-flops SF1 and SFF2 and a plurality of demultiplexers 421_1 and 421_2, parallel processing may be performed in transferring a control value to the first to fourth control flip-flops CFF1~CFF4.

Figure 9:
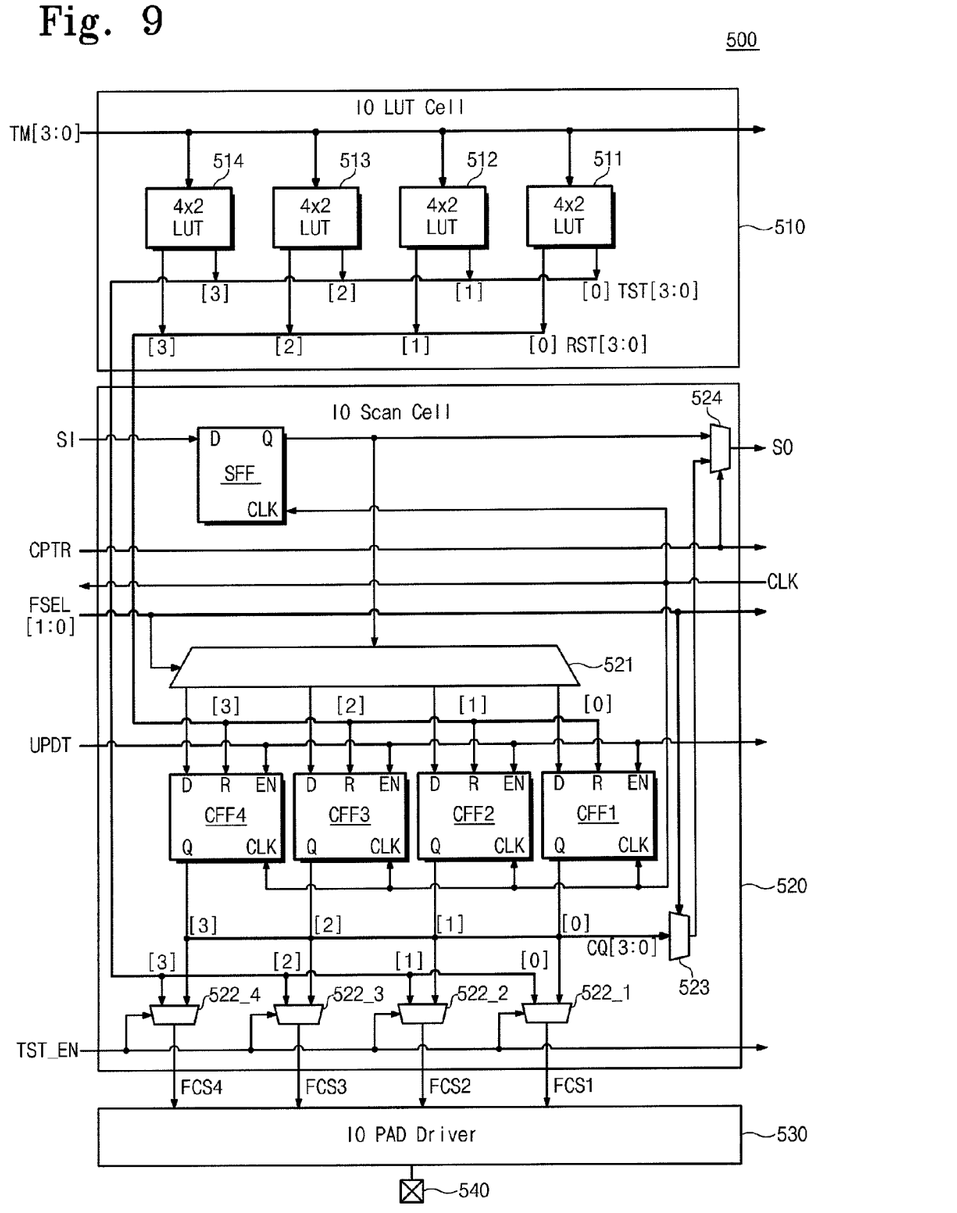
FIG. 9 is a circuit diagram illustrating further another embodiment of the IO wrapper shown in FIG. 1.

FIG. 9 is a circuit diagram illustrating another embodiment of the TO wrapper shown in FIG. 1. An IO wrapper 500 according to another embodiment of the inventive concept is identical to the IO wrapper 300 shown in FIG. 3 except for configurations of a capture signal CPTR among control signals and first and second capture units 523 and 524. Therefore, corresponding components between the IO wrappers 300 and 500 will not be described in further detail.

Referring to FIG. 9, an IO scan cell 520 may include first and second capture units 523 and 524. Each of the first and second capture units 523 and 524 may be configured using a multiplexer. The first capture unit 523 selects one of first to fourth control values CQ[0]~CQ[3] stored in first to fourth control flip-flops CFF1~CFF4 according to a function selection signal and transfers the selected signal to the second capture unit 524.

The second capture unit 524 receives a control value stored in a scan flip-flop SFF and a control value transferred from the first capture unit 523. When a capture signal CPTR is applied, the second capture unit 524 selects the control value transferred from the first capture unit 523. On the other hand, when the capture signal CPTR is not applied, the second capture unit 524 selects the control value stored in the scan flip-flop. The second capture unit 524 outputs the selected control value as a shift output signal SO. The shift output signal SO is transferred as a shift input signal SI of the next IO scan cell (not shown).

If the control value stored in the scan flip-flop SFF is different from that transferred from the first capture unit 523, this difference means that there is an error while the control value stored in the scan flip-flop SFF is transferred to one of first to fourth control flip-flops CFF1~CFF4.

According to the IO scan cell 520 including the first and second capture units 523 and 524, debugging may be performed to determine whether the control value stored in the scan flip-flop SFF is transferred to one of the first to fourth flip-flops CFF1~CFF4 without an error according to the function selection signal FSEL[1:0].

According to at least one of above-described embodiments of the inventive concept, an area occupied by IO control signal lines between an IO controller and IO PADs is reduced to improve the integration density of a semiconductor device.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative. Thus, the scope of the inventive concept is to be determined by the broadest permissible interpretation of the following claims and their equivalents, and shall not be restricted or limited by the foregoing description.

What is claimed is:

1. A semiconductor device comprising:
an input/output controller configured to generate a clock signal and a shift input signal having a control value;
a first wrapper connected to the input/output controller and including a first scan flip-flop, the first scan flip-flop configured to receive the shift input signal and generate a shift output signal having the control value;
a second wrapper connected to the first wrapper and including a second scan flip-flop, a driver and a pad connected to the driver, wherein the second scan flip-flop, serially connected to the first scan flip-flop, is configured to receive the shift output signal from the first scan flip-flop and store the control value of the shift output signal, wherein the driver is configured to provide one of a plurality of functions to the pad based on the control value of the second scan flip-flop.

2. The semiconductor device of claim 1, wherein the input/output controller is configured to further provide a test mode signal to the first and second wrapper, the first and second wrapper each converting the test mode signal to a test signal and a reset signal, respectively.

3. The semiconductor device of claim 2, wherein the second wrapper further includes a demultiplexer and a plurality of control flip-flops, wherein the demultiplexer is connected to the second scan flip-flop and is configured to receive the shift output signal from the second scan flip-flop and the demultiplexer routes the shift output signal to one of the plurality of control flip-flops in response to a function selection signal from the input/output controller, wherein the control value is stored in the one of the plurality of control flip-flops.

4. The semiconductor device of claim 3, wherein the plurality of control flip-flops is connected to the demultiplexer and one of the plurality of control flip-flops is configured to receive the routed shift output signal of the demultiplexer, wherein the plurality of control flip-flops further receives the reset signal and an update signal to generate control information, wherein the update signal is transmitted from the input/output controller.

5. The semiconductor device of claim 4, wherein the second wrapper further includes a plurality of multiplexers, each of the multiplexers configured to select the control information or a test signal to generate an IO PAD function control signal in response to a test enable signal from the input/output controller.

6. The semiconductor device of claim 3, wherein a number of the plurality of control flip-flops corresponds to a number of the plurality of functions that the driver is configured to provide to the pad.

7. A semiconductor device comprising:
an input/output controller configured to generate a clock signal and generate a shift input signal including at least a first control value, a second control value, a third control value, wherein the input/output controller serially generates the first to third control values;
a first wrapper including a first pad, a first driver, and a first scan flip-flop, wherein the first scan flip-flop is connected to the input/output controller and is configured to receive the shift input signal and stores the third control value to set a function of the first pad;
a second wrapper including a second pad, a second driver, and a second scan flip-flop, wherein the second scan flip-flop is connected to the first scan flip-flop and is configured to store the second control value to set a function of the second pad;
a third wrapper including a third pad, a third driver, and a third scan flip-flop, wherein the third scan flip-flop is connected to the second scan flip-flop and is configured to store the first control value to set a function of the third pad,
wherein the first control value is shifted from the first scan flip-flop to the third scan flip-flop through the second scan flip-flop, the second control value is shifted from the first scan flip-flop to the second scan flip-flop, wherein the first to third drivers, respectively, are configured to provide a plurality of functions to the first to third pads.

8. The semiconductor device of claim 7, wherein the clock signal is shared by the first to third scan flip-flops, wherein the input/output controller provides the clock signal to the third wrapper and the clock signal is transmitted in a direction from the third wrapper to the first wrapper through the second wrapper.

9. The semiconductor device of claim 7, wherein the first to third control values are shifted in synchronization with the clock signal.

10. The semiconductor device of claim 7, wherein the input/output controller is further configured to provide a test mode signal to the first to third wrappers, the second wrapper including a look-up table configured to convert the test mode signal into a test signal and a reset signal.

11. The semiconductor device of claim 7, wherein the second wrapper further includes a demultiplexer and a plurality of control flip-flops, wherein the demultiplexer is connected to the second scan flip-flop and is configured to:
receive the second control value of the second scan flip-flop; and
route the second control value to one of the plurality of control flip-flops in response to a function selection signal from the input/output controller.

12. The semiconductor device of claim 11, wherein the second wrapper further includes a plurality of multiplexers, each of the plurality of multiplexers connected to each of the plurality of control flip-flops, each of the plurality of multiplexers configured to select the second control value or a test signal in response to a test enable signal from the input/output controller.

13. The semiconductor device of claim 11, wherein the second wrapper further includes a capture unit connected to the second scan flip-flop and the plurality of control flip-flops and configured to:
select an output of the second scan flip-flop or an output of the plurality of control flip flops; and
transmit the selected output to the third scan flip-flop in response to a capture signal from the input/output controller.

14. A semiconductor device comprising:
a plurality of wrappers serially connected to each other, each of the plurality of wrappers including a scan flip-flop, a driver, and a pad connected to the driver, the driver configured to provide a plurality of functions to the pad, the plurality of wrappers including a first wrapper at one end and a last wrapper at the other end; and
an input/output controller configured to:
generate a clock signal and a plurality of control signals including a shift input signal; and
provide the shift input signal to the scan flip-flop of the first wrapper, wherein the shift input signal includes a plurality of control values serially generated by the input/output controller,
wherein the clock signal is shared by the scan flip-flop of each of the plurality of wrappers,
wherein in a first mode of operation, the plurality of control values are shifted through the scan flip-flop of each of the plurality of wrappers in response to the clock signal, and in a second mode of operation, the driver of each of the plurality of wrappers is set to one of the plurality of functions based on a corresponding control value stored in the scan flip-flop of each of the plurality of wrappers.

15. The semiconductor device of claim 14, wherein the input/output controller is further configured to generate a test mode signal and provide the test mode signal to the plurality of wrappers, and wherein each of the plurality of wrappers is configured to convert the test mode signal to a test signal and a reset signal.

16. The semiconductor device of claim 15, wherein each of the plurality of wrappers further includes a demultiplexer and a plurality of control flip-flops, the demultiplexer connected to the scan flip-flop and routing, in the second mode of operation, the corresponding control value stored in the scan flip-flop to one of the plurality of control flip-flops in response to a function selection signal from the input/output controller.

17. The semiconductor device of claim 16, wherein the plurality of control flip-flops are configured to store, in response to an update signal from the input/output controller, the corresponding control value routed by demultiplexer and generate control information including the corresponding control value routed by demultiplexer.

18. The semiconductor device of claim 17, wherein each of the plurality of wrappers further includes a plurality of multiplexers, and wherein each of the plurality of multiplexers is connected to a corresponding control flip-flop of the plurality of control flip-flops and is configured to select the control information or the test signal to generate an IO PAD function control signal in response to a test enable signal from the input/output controller.

19. The semiconductor device of claim 16, wherein a number of the plurality of control flip-flops corresponds to that of the plurality of functions that the driver of the plurality of wrappers provides.

20. A method of setting a function of a pad of a semiconductor device, the method comprising:
generating a clock signal;
serially generating a plurality of control values;
serially providing the plurality of control values to a first wrapper of a plurality of wrappers, wherein the plurality of wrappers are serially connected to each other and includes the first wrapper at one end and a last wrapper at the other end, wherein the plurality of wrappers shares the clock signal;

shifting the plurality of control values from the first wrapper to the last wrapper in response to the clock signal in a first mode of operation, wherein the clock signal is provided to the last wrapper and is transmitted from the last wrapper to the first wrapper; and setting the function of the pad using the plurality of control values stored in the plurality of wrappers in a second mode of operation.

21. An IO wrapper comprising:
a clock input receiving a clock;
a scan input receiving a shift input signal;
a scan register configured to receive the shift input signal in response to the clock and generate a control value;
at least one control register configured to receive the control value and generate at least one control signal to set a function of the IO wrapper;
an IO driver configured to determine the function of the IO wrapper in response to the at least one control signal; and
an IO PAD connected to the IO driver.

22. The IO wrapper of claim 21, further comprising:
a converter configured to set the function of the IO wrapper in response to at least one mode input signal.

23. The IO wrapper of claim 22, wherein the converter comprise a lookup table configured to generate a test value and a reset value in response to the at least one mode input signal.

24. The IO wrapper of claim 23, further comprising:
a multiplexer configured to receive the control value of the scan register from one of the at least one control register and the test value from the converter and configured to output an IO PAD function control signal to the IO driver.

25. The IO wrapper of claim 21, further comprising:
a scan output configured to provide the control value of the scan register as a shift input signal to a next IO wrapper.

26. The IO wrapper of claim 21, further comprising:
a demultiplexer configured to receive the control value of the scan register and route the control value of the scan register to a plurality of control flip-flops.

* * * * *